United States Patent
Cheong et al.

(10) Patent No.: US 7,759,248 B2
(45) Date of Patent: Jul. 20, 2010

(54) SEMICONDUCTOR MEMORY DEVICE AND METHOD OF FABRICATING THE SAME

(75) Inventors: Seong-Hwee Cheong, Seoul (KR); Sang-Woo Lee, Seoul (KR); Jong-Won Hong, Suwon-si (KR); Seung-Gil Yang, Yongin-si (KR); Kyung-In Choi, Chuncheon-si (KR); Hyun-Bae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 582 days.

(21) Appl. No.: 11/585,087

(22) Filed: Oct. 24, 2006

(65) Prior Publication Data
US 2007/0134914 A1      Jun. 14, 2007

(30) Foreign Application Priority Data
Oct. 24, 2005   (KR) ...................... 10-2005-0100442

(51) Int. Cl.
*H01L 21/44*       (2006.01)
*H01L 23/48*       (2006.01)
(52) U.S. Cl. ................... 438/680; 438/653; 438/683
(58) Field of Classification Search ............ None
See application file for complete search history.

(56) References Cited

U.S. PATENT DOCUMENTS 6,020,443 A * 2/2000 Woodson et al. ............ 526/135
7,276,443 B2 * 10/2007 Kim et al. ................... 438/680

FOREIGN PATENT DOCUMENTS

| JP | 2000-223441 | | 8/2000 |
|---|---|---|---|
| KR | 10-2001-0061789 | | 7/2001 |
| KR | 10-2005-0019469 | | 3/2005 |
| KR | 2005073034 | * | 7/2005 |

* cited by examiner

*Primary Examiner*—Zandra Smith
*Assistant Examiner*—Pamela E Perkins
(74) *Attorney, Agent, or Firm*—Harness, Dickey & Pierce, P.L.C.

(57) ABSTRACT

A semiconductor memory device and a method of fabricating the same are disclosed. The semiconductor memory device may include a conductive layer doped with impurities, a non-conductive layer on the conductive layer and undoped with impurities, an interlayer insulating film on the non-conductive layer and having a contact hole for exposing an upper surface of the non-conductive layer, an ohmic tungsten film on the contact hole, a lower portion of the ohmic tungsten film permeating the non-conductive layer to come in contact with the conductive layer, a tungsten nitride film on the contact hole on the ohmic tungsten film, and a tungsten film on the tungsten nitride film to fill the contact hole.

17 Claims, 3 Drawing Sheets

SEMICONDUCTOR MEMORY DEVICE AND METHOD OF FABRICATING THE SAME

PRIORITY STATEMENT

This application claims priority under 35 USC §119 to Korean Patent Application No. 10-2005-0100442, filed on Oct. 24, 2005, in the Korean Intellectual Property Office (KIPO), the entire contents of which are incorporated herein by reference.

BACKGROUND

1. Field

Example embodiments relate to a semiconductor memory device and a method of fabricating the same. Other example embodiments relate to a semiconductor memory device and a method of fabricating the same, in which the contact resistance of the device may be reduced.

2. Description of the Related Art

The design rule of a semiconductor memory device may be reduced as a higher-level integration of the semiconductor memory device is needed. The size of a contact for connecting lines in the semiconductor memory device may be reduced and this may cause an aspect ratio of the contact to increase. A contact may be made of tungsten (W) that has an improved step coverage and relatively low resistance. When a contact hole is filled with the tungsten as a contact-forming material, an ohmic layer may be formed to relieve a difference in electrical resistance between the tungsten and an interlayer dielectric film, for example, a silicon oxide film.

A barrier layer may then be formed on the ohmic layer so as to reduce or prevent damage to the ohmic layer. A titanium silicide ($TiSi_x$) film and a titanium nitride (TiN) film may be used as the ohmic layer and the barrier layer, which may be formed before the contact hole is filled with the tungsten. As an aspect ratio of the contact increases, the thickness of the titanium silicide film and the titanium nitride film may also be increased and this may cause the contact resistance to be increased. An ohmic tungsten (W) film and a tungsten nitride (WN) film may be used instead of the titanium silicide film and the titanium nitride film. The ohmic tungsten film and the tungsten nitride film may be formed using $B_2H_6$ and $WF_6$ gases.

If a polysilicon or silicon germanium substrate doped with n-type impurities is used as a lower substrate when the tungsten film and the tungsten nitride film are formed using the $B_2H_6$ gas, the substrate may be counter-doped with boron ions. Accordingly, the contact resistance of the semiconductor memory device may be increased and this may cause the contact to be unstable.

SUMMARY

Example embodiments provide a semiconductor memory device that may reduce the contact resistance. Example embodiments also provide a method of fabricating a semiconductor memory device that may reduce the contact resistance.

According to example embodiments, a semiconductor memory device may include a conductive layer doped with impurities, a non-conductive layer on the conductive layer and undoped with impurities, an interlayer insulating film on the non-conductive layer and having a contact hole for exposing an upper surface of the non-conductive layer, an ohmic tungsten film on the contact hole, a lower portion of the ohmic tungsten film permeating the non-conductive layer to contact the conductive layer, a tungsten nitride film on the contact hole on the ohmic tungsten film and a tungsten film formed on the tungsten nitride film to fill the contact hole.

According to example embodiments, a method of fabricating a semiconductor memory device may include forming a conductive layer doped with impurities, forming a non-conductive layer undoped with impurities on the conductive layer, forming an interlayer insulating film on the non-conductive layer, the interlayer insulating film having a contact hole for exposing an upper surface of the non-conductive layer, forming an ohmic tungsten film on the contact hole, a lower portion of the ohmic tungsten film permeating the non-conductive layer to contact the conductive layer, forming a tungsten nitride film on the contact hole on the ohmic tungsten film, and forming a tungsten film on the tungsten nitride film to fill the contact hole.

BRIEF DESCRIPTION OF THE DRAWINGS

Example embodiments will be more clearly understood from the following detailed description taken in conjunction with the accompanying drawings.

FIG. 1 is a diagram illustrating a semiconductor memory device according to example embodiments; and FIGS. 2 to 5 are diagrams illustrating in order a process of fabricating a semiconductor memory device according to example embodiments.

DETAILED DESCRIPTION OF EXAMPLE EMBODIMENTS

Figure 1:
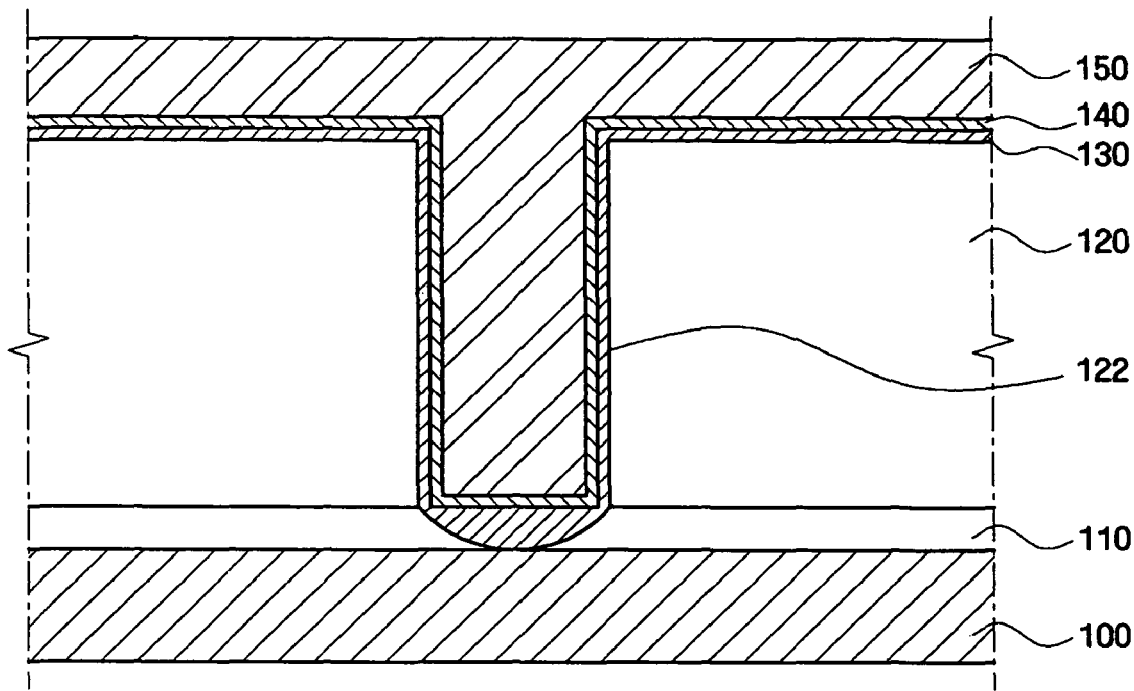
FIGS. 1-5 represent non-limiting, example embodiments as described herein.

Hereinafter, example embodiments will be described more fully with reference to the accompanying drawings, in which example embodiments are shown. In the drawings, like reference numerals denote like elements, and the sizes and thicknesses of layers and regions are exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a semiconductor memory device according to example embodiments. As shown in FIG. 1, the semiconductor memory device according to example embodiments may include a conductive layer 100 doped with impurities and a non-conductive layer 110 which is undoped with impurities. The conductive layer 100 may be formed with a thickness of about 2000 Å to 2500 Å and may be a polysilicon ($n^+$ poly-Si) film and/or a silicon germanium ($n^+$ SiGe) film, which is doped with n-type impurities. This conductive layer 100 may be used as a plate electrode and/or a resistive layer in a DRAM device. The non-conductive layer 110 may be formed on the conductive layer 100 with a thickness of less than about 300 Å. The non-conductive layer 110 may reduce or prevent the contact resistance of a contact, which is electrically connected to the conductive layer 100, from being increased. The non-conductive layer 110 may be an undoped polysilicon (poly-Si) film and/or silicon germanium (SiGe) film.

An interlayer insulating film 120 may be deposited on the non-conductive layer 110 and the interlayer insulating film 120 may include a contact hole 122 exposing an upper side of the non-conductive layer 110. An ohmic tungsten film 130 may be formed on the interlayer insulating film 120 on the contact hole 122, in order to increase the adhesion of a tungsten film 150 filling the contact hole 122. The ohmic tungsten film 130 may be formed with a thickness of about 30 to 70 Å, except for the lower portion of the ohmic tungsten film 130, which is thickly formed to permeate the non-conductive layer 110 exposed by the contact hole 122 and to contact the upper surface of the conductive layer 100. The lower portion of the ohmic tungsten film 130 may be formed in the non-conductive layer 110 and the lower surface of the ohmic tungsten film 130 may be more thickly formed to contact the upper surface of the conductive layer 100 doped with n-type impurities. The ohmic tungsten film 130 may be doped with p-type impurities. Because the lower portion of the ohmic tungsten film 130 is formed in the non-conductive layer 110, it may be possible to reduce or prevent the contact resistance from increasing on the junction between the conductive layer 100 and the ohmic tungsten film 130.

A tungsten nitride film 140 may be formed with a thickness of about 30 Å to about 70 Å on the contact hole 122 on the ohmic tungsten film 130. The tungsten nitride film 140 may reduce or prevent tungsten atoms of the tungsten film 150 filling the contact hole from reacting with silicon. The tungsten film 150 filling the contact hole 122 may be formed on the tungsten nitride film 140. The method of fabricating a semiconductor memory device according to example embodiments will now be described with reference to FIGS. 2 to 5.

Figure 2:
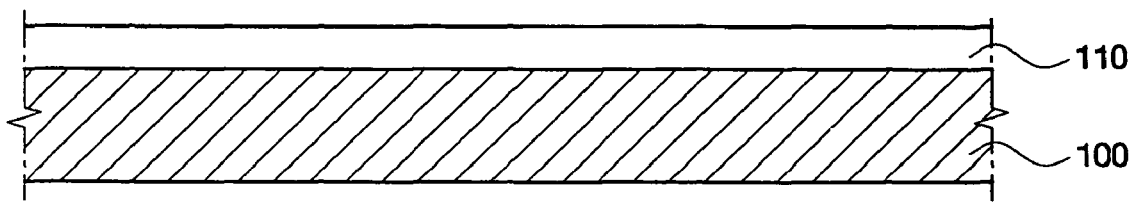

FIGS. 2 to 5 are diagrams illustrating the method of fabricating a semiconductor memory device according to example embodiments. As shown in FIG. 2, the conductive layer 100 doped with n-type impurities may be formed with a thickness of about 2,000 Å to about 2,500 Å. The conductive layer 100 may be used as a plate electrode and/or a resistive layer in the DRAM device. The polysilicon film doped with n-type impurities may be formed through a chemical vapor deposition process under an atmosphere of a source gas (e.g., $SiH_3$ and/or $SiH_2Cl_2$) and an impurity gas (e.g., $PH_3$) at a temperature of about 400° C. to about 800° C. The silicon germanium film doped with n-type impurities may be formed through a chemical vapor deposition process under an atmosphere of a source gas (e.g., $SiH_4$ and/or $GeH_4$) and an impurity gas (e.g., $PH_3$) at a temperature of about 300° C. to about 700° C.

The non-conductive layer 110 undoped with impurities may be formed with a thickness of less than about 300 Å on the conductive layer 100. An undoped polysilicon film may be formed through a chemical vapor deposition process under an atmosphere of a source gas (e.g., $SiH_4$ and/or $SiH_2Cl_2$) at a temperature of about 400° C. to about 800° C. Alternatively, an undoped silicon germanium film may be formed through a chemical vapor deposition process under an atmosphere of a source gas of $SiH_4$ and $GeH_4$ and a carrier gas of $H_2$ at a temperature of about 300° C. to about 700° C.

Figure 3:
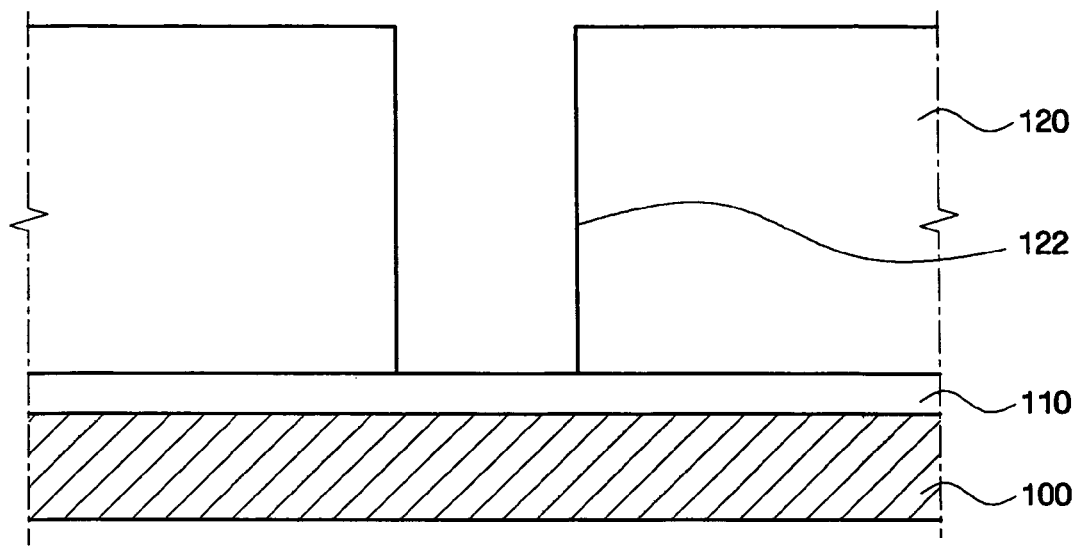

As shown in FIG. 3, the interlayer insulating film 120 of an adequate thickness may be laminated on the non-conductive layer 110. The interlayer insulating film 120 may be formed with a silicon oxide (e.g., a BSG (Borosilicate Glass), PSG (PhosphoSilicate glass), BPSG (BoroPhosphoSilicate Glass) and/or USG (Undoped Silicate Glass)). A photoresist pattern (not shown) may be formed on the interlayer insulating film 120 in order to form the contact hole 122. The interlayer insulating film 120 may be partially etched in order to form a contact hole 122 using the photoresist pattern (not shown) as an etching mask, until the upper surface of the non-conductive layer 110 is exposed.

Figure 4:
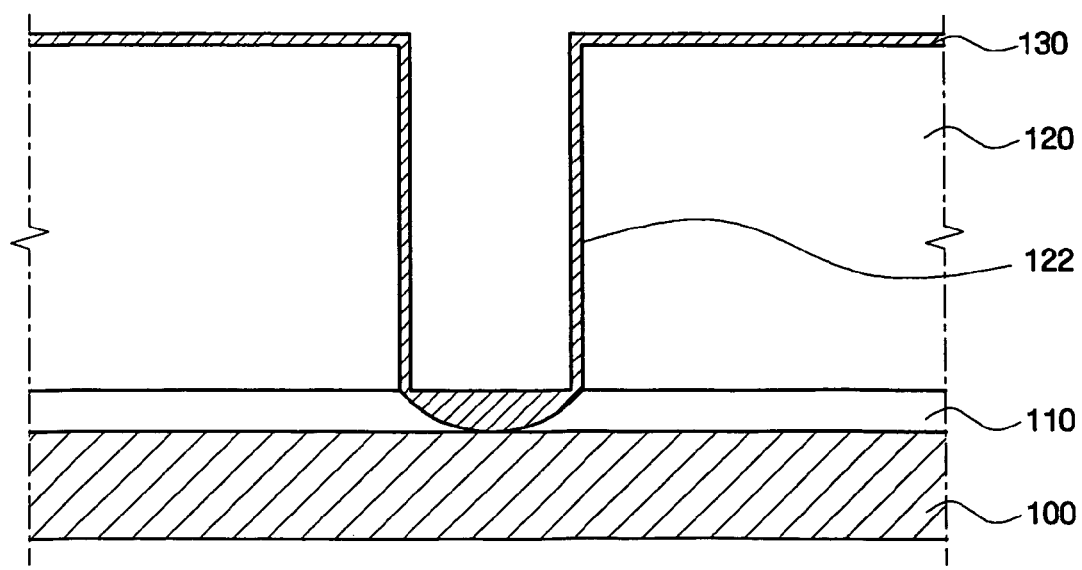

Thereafter, as shown in FIG. 4, the ohmic tungsten film 130 may be formed on the entire surface of the interlayer insulating film 120 having the contact hole 122 to expose the upper surface of the non-conductive layer 110. The ohmic tungsten film 130 may be formed on the contact hole 122 through an atomic layer deposition (ALD) process. The ohmic tungsten film 130 may be formed with a thickness of about 30 Å to about 50 Å. When the ohmic tungsten film 130 is formed, the lower portion of the ohmic tungsten film 130 may permeate through the non-conductive layer 110, such that the ohmic tungsten film 130 may come in contact with the upper surface of the conductive layer 100.

The method of forming the ohmic tungsten film 130 using the ALD process will be explained in more detail. Boron atoms may be deposited on the interlayer insulating film 120 and the non-conductive layer 110 by supplying $B_2H_6$ gas into a reaction chamber. An inert gas (e.g., an Ar gas) may be supplied into the reaction chamber to purge non-reacted gases and/or reacted gases. $WF_6$ gas may be supplied to the reaction chamber to substitute tungsten atoms for the boron atoms. While such a process is repeated, the source gas may attack the non-conductive layer 110. The ohmic tungsten film 130 may permeate the non-conductive layer 110, and the above process may be continuously performed until the ohmic tungsten film 130 having permeated the non-conductive layer 110 comes in contact with the conductive layer 100. In the method where the lower part of the ohmic tungsten film 130 permeates through the non-conductive layer 110 and the ohmic tungsten film 130 comes in contact with the upper surface of the conductive layer 100, conditions (e.g., a flow rate of a gas, temperature, pressure and/or time) may vary depending upon the thickness of the non-conductive layer 110.

On the other hand, the ohmic tungsten film 130 may be formed through performing the ALD process using the $WF_6$ gas. The $WF_6$ gas may be supplied into the reaction chamber to reduce silicon atoms of the non-conductive layer 110. Fluorine ions may attack the non-conductive layer 110, thereby forming the ohmic tungsten film 130 in the non-conductive layer 110. The process may be repeated until the ohmic tungsten film 130 comes in contact with the upper surface of the conductive layer 100. In the process of the ohmic tungsten film 130 coming into contact with the conductive layer 100, conditions (e.g., a flow rate of a gas, temperature, pressure and/or time) may vary depending upon the thickness of the non-conductive layer 110.

Figure 5:
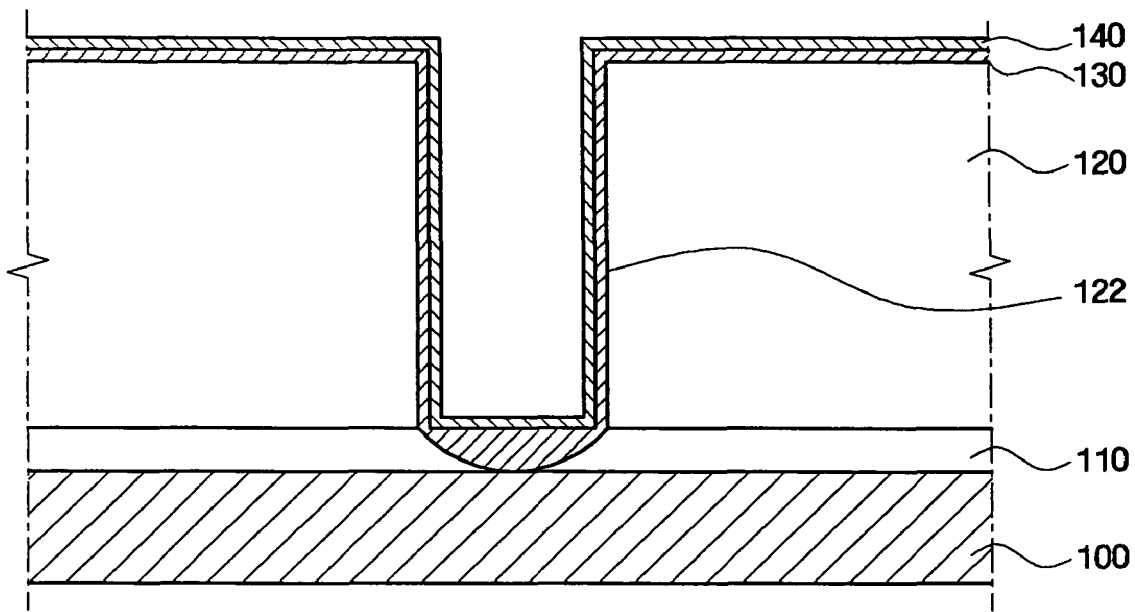

By forming the lower portion of the ohmic tungsten film 130 in the non-conductive layer 110, it may be possible to reduce or prevent the conducing layer 100 from being counter-doped when the ohmic tungsten film 130 is formed. Accordingly, it may be possible to reduce or prevent the contact resistance from increasing on the junction between the ohmic tungsten film 130 and the conductive layer 100. After the ohmic tungsten film 130 is formed, as shown in FIG. 5, the tungsten nitride film 140 may be formed on the contact hole 122 on the ohmic tungsten film 130 as a barrier film. The tungsten nitride film 140 may be formed with a thickness of about 30 Å to about 50 Å through the atomic layer deposition process. According to the method of forming the tungsten nitride film 140, boron atoms may be deposited on the surface of the ohmic tungsten film 130 by supplying the $B_2H_6$ gas into the reaction chamber. After the reaction chamber is purged by an inert gas (e.g., Ar), the boron chamber. After the reaction chamber is purged by the inert gas, the tungsten atoms may be reacted with nitrogen atoms by supplying the $NH_3$ gas into the reaction chamber.

As shown in FIG. 1, the tungsten film 150 may be formed to fill the contact hole 122 on which the ohmic tungsten film 130 and the tungsten nitride film 140 are deposited. The tungsten film 150 may be formed through the chemical vapor deposition process using the $WF_6$ gas as the source gas and the $H_2$ gas as the carrier gas.

As described above, according to the semiconductor memory device and the method of fabricating the same according to example embodiments, the non-conductive layer may be formed on the conductive layer, and the source gas for forming the ohmic tungsten layer may attack the non-conductive layer, which forms the ohmic tungsten film contacting the upper surface of the conductive layer in the non-conductive layer. Accordingly, when the ohmic tungsten film is formed, it may be possible to reduce or prevent the conductive layer from being count-doped by $B_2H_6$ gas. It may be possible to reduce or prevent an increase in the contact resistance of the semiconductor memory device and to reduce or prevent the contact from being relatively unstably formed.

Although example embodiments have been described for illustrative purposes, those skilled in the art will appreciate that various modifications, additions and substitutions are possible, without departing from the scope and spirit of the accompanying claims.

What is claimed is:

1. A semiconductor memory device comprising:
    a conductive layer doped with impurities;
    a non-conductive layer on the conductive layer and undoped with impurities;
    an interlayer insulating film on the non-conductive layer and having a contact hole for exposing an upper surface of the non-conductive layer;
    an ohmic tungsten film on the contact hole, a lower portion of the ohmic tungsten film permeating the non-conductive layer to contact the conductive layer;
    a tungsten nitride film on the contact hole on the ohmic tungsten film; and
    a tungsten film on the tungsten nitride film to fill the contact hole.

2. The semiconductor memory device of claim 1, wherein the conductive layer is doped with n-type impurities.

3. The semiconductor memory device of claim 2, wherein the conductive layer is a polysilicon film or silicon germanium film, which is doped with n-type impurities.

4. The semiconductor memory device of claim 1, wherein the non-conductive layer is a polysilicon film or silicon germanium film, which is undoped with impurities.

5. The semiconductor memory device of claim 1, wherein the non-conductive layer is formed with a thickness of less than about 300 Å.

6. The semiconductor memory device of claim 1, wherein the conductive layer is doped with n-type impurities, and the ohmic tungsten film is doped with p-type impurities.

7. A method of fabricating a semiconductor memory device, comprising:
    forming a conductive layer doped with impurities;
    forming a non-conductive layer undoped with impurities on the conductive layer;
    forming an interlayer insulating film on the non-conductive layer, the interlayer insulating film having a contact hole for exposing an upper surface of the non-conductive layer;
    forming an ohmic tungsten film on the contact hole, a lower portion of the ohmic tungsten film permeating the non-conductive layer to contact the conductive layer;
    forming a tungsten nitride film on the contact hole on the ohmic tungsten film; and
    forming a tungsten film on the tungsten nitride film to fill the contact hole.

8. The method of claim 7, wherein forming the conductive layer includes forming a conductive layer doped with n-type impurities.

9. The method of claim 8, wherein forming the conductive layer includes forming a polysilicon film or silicon germanium film doped with n-type impurities.

10. The method of claim 7, wherein forming the non-conductive layer includes forming a polysilicon film or silicon germanium film which is undoped with impurities.

11. The method of claim 7, wherein forming the non-conductive layer includes forming the non-conductive layer with a thickness of less than about 300 Å.

12. The method of claim 7, wherein forming the conductive layer includes a conductive layer doped with n-type impurities, and forming the ohmic tungsten film includes a conductive layer doped with p-type impurities.

13. The method of claim 12, wherein forming the ohmic tungsten film includes forming the ohmic tungsten film using an atomic layer deposition (ALD) process using a source gas.

14. The method of claim 13, wherein the source gas includes at least one of a $B_2H_6$ gas and a $WF_6$ gas.

15. The method of claim 7, wherein forming the conductive layer includes forming the conductive layer doped with n-type impurities and forming the ohmic tungsten film includes forming the ohmic tungsten film not doped with impurities.

16. The method of claim 15, wherein forming the ohmic tungsten film includes forming the ohmic tungsten film through an atomic layer deposition (ALD) process using a source gas.

17. The method of claim 16, wherein the source gas includes at least one of a $B_2H_6$ gas and a $WF_6$ gas.

* * * * *